(12) United States Patent
Yu et al.

(10) Patent No.: US 12,218,006 B2
(45) Date of Patent: *Feb. 4, 2025

(54) SYSTEM, DEVICE AND METHODS OF MANUFACTURE

(71) Applicant: Taiwan Semiconductor Manufacturing Co., Ltd., Hsinchu (TW)

(72) Inventors: Chen-Hua Yu, Hsinchu (TW); Wei Ling Chang, Hsinchu (TW); Chuei-Tang Wang, Taichung (TW); Tin-Hao Kuo, Hsinchu (TW); Che-Wei Hsu, Kaohsiung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/503,453

(22) Filed: Nov. 7, 2023

(65) Prior Publication Data

US 2024/0071825 A1 Feb. 29, 2024

Related U.S. Application Data

(63) Continuation of application No. 17/870,075, filed on Jul. 21, 2022, now Pat. No. 11,848,235, which is a
(Continued)

(51) Int. Cl.
*H01L 21/768* (2006.01)
*H01L 21/77* (2017.01)
(Continued)

(52) U.S. Cl.
CPC .. *H01L 21/76895* (2013.01); *H01L 21/76898* (2013.01); *H01L 21/77* (2013.01);
(Continued)

(58) Field of Classification Search
CPC ......... H01L 21/76895; H01L 21/76898; H01L 21/77; H01L 23/528; H01L 23/4006; H01L 24/03; H01L 24/06; H01L 25/18
See application file for complete search history.

(56) References Cited

U.S. PATENT DOCUMENTS

| 8,987,922 B2 | 3/2015 | Yu et al. |
| 9,196,532 B2 | 11/2015 | Tu et al. |

(Continued)

*Primary Examiner* — Nathan W Ha
(74) *Attorney, Agent, or Firm* — Slater Matsil, LLP

(57) ABSTRACT

Systems, devices and methods of manufacturing a system on silicon wafer (SoSW) device and package are described herein. A plurality of functional dies is formed in a silicon wafer. Different sets of masks are used to form different types of the functional dies in the silicon wafer. A first redistribution structure is formed over the silicon wafer and provides local interconnects between adjacent dies of the same type and/or of different types. A second redistribution structure may be formed over the first redistribution layer and provides semi-global and/or global interconnects between non-adjacent dies of the same type and/or of different types. An optional backside redistribution structure may be formed over a second side of the silicon wafer opposite the first redistribution layer. The optional backside redistribution structure may provide backside interconnects between functional dies of different types.

20 Claims, 12 Drawing Sheets

Related U.S. Application Data continuation of application No. 16/926,107, filed on Jul. 10, 2020, now Pat. No. 11,404,316.

(60) Provisional application No. 62/954,286, filed on Dec. 27, 2019.

(51) Int. Cl.
   *H01L 23/00*      (2006.01)
   *H01L 23/528*     (2006.01)
   *H01L 25/18*      (2023.01)
   *H01L 23/40*      (2006.01)

(52) U.S. Cl.
   CPC ............ *H01L 23/528* (2013.01); *H01L 24/03* (2013.01); *H01L 24/06* (2013.01); *H01L 25/18* (2013.01); *H01L 23/4006* (2013.01); *H01L 2023/4087* (2013.01); *H01L 2224/02372* (2013.01); *H01L 2224/02379* (2013.01); *H01L 2224/06182* (2013.01); *H01L 2224/16145* (2013.01)

(56) References Cited

U.S. PATENT DOCUMENTS

| | | |
|---|---|---|
| 9,196,559 B2 | 11/2015 | Tsai et al. |
| 9,257,333 B2 | 2/2016 | Lu et al. |
| 9,263,839 B2 | 2/2016 | Chen et al. |
| 9,275,924 B2 | 3/2016 | Wang et al. |
| 9,275,925 B2 | 3/2016 | Chen et al. |
| 9,281,254 B2 | 3/2016 | Yu et al. |
| 9,372,206 B2 | 6/2016 | Wu et al. |
| 9,496,189 B2 | 11/2016 | Yu et al. |
| 10,103,038 B1 | 10/2018 | Yoo et al. |
| 11,404,316 B2 * | 8/2022 | Yu .................. H01L 24/03 |
| 2017/0294460 A1 | 10/2017 | Lee |
| 2018/0184538 A1 * | 6/2018 | Bayerer ............ H01L 23/24 |
| 2018/0277493 A1 | 9/2018 | Shima et al. |
| 2018/0286766 A1 | 10/2018 | Nishida et al. |
| 2018/0301408 A1 | 10/2018 | Uchiyama |
| 2018/0301425 A1 | 10/2018 | Mason et al. |
| 2018/0301430 A1 | 10/2018 | Kuo et al. |
| 2018/0374845 A1 | 12/2018 | Colinge et al. |
| 2019/0013288 A1 | 1/2019 | Kim et al. |
| 2019/0148267 A1 | 5/2019 | Chen et al. |
| 2019/0279998 A1 | 9/2019 | Yamakoshi et al. |
| 2019/0333931 A1 | 10/2019 | Jung et al. |
| 2019/0355657 A1 * | 11/2019 | Miyasaka ........ H01L 23/4006 |
| 2020/0075623 A1 | 3/2020 | Ito et al. |
| 2020/0092506 A1 | 3/2020 | Park et al. |
| 2020/0127035 A1 | 4/2020 | Oseto et al. |
| 2020/0176373 A1 | 6/2020 | Choi |
| 2020/0203270 A1 * | 6/2020 | Liu .................. H01L 24/09 |
| 2020/0243429 A1 | 7/2020 | Lai et al. |
| 2020/0243499 A1 | 7/2020 | Lee et al. |
| 2020/0328220 A1 | 10/2020 | Derner et al. |
| 2020/0373321 A1 | 11/2020 | Kwak et al. |
| 2020/0402905 A1 | 12/2020 | Otsu et al. |
| 2021/0057427 A1 | 2/2021 | Oh |
| 2021/0098465 A1 | 4/2021 | Chuang et al. |
| 2021/0233865 A1 * | 7/2021 | Tarui ................ H01Q 21/065 |

* cited by examiner

SYSTEM, DEVICE AND METHODS OF MANUFACTURE

PRIORITY CLAIM AND CROSS-REFERENCE

This application is a continuation of U.S. application Ser. No. 17/870,075, filed on Jul. 21, 2022, now U.S. Pat. No. 11,848,235, issued on Dec. 19, 2023, entitled "System, Device and Methods of Manufacture," which is a continuation of U.S. application Ser. No. 16/926,107, filed on Jul. 10, 2020, now U.S. Pat. No. 11,404,316 issued Aug. 2, 2022, entitled "System, Device and Methods of Manufacture," which application claims priority to and the benefit of U.S. Provisional Application No. 62/954,286, filed on Dec. 27, 2019, entitled: "Semiconductor Devices and Methods of Manufacturing," which applications are hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, wafer level integration and packaging has emerged as an effective alternative to further reduce the physical size of a semiconductor device. A plurality of functional dies (e.g., active circuits such as logic, memory, processor circuits and the like) of a certain type may be formed on a substrate. In wafer level packages such as reconstituted wafers, functional dies of different types are singulated from their respective substrates, placed together on a carrier substrate, and packaged together as a single functional device. Other wafer process technologies (e.g., system-on-integrated circuit (SoIC), integrated passive devices (IPD), or the like) may also be integrated with the functional dies in order to form a functional system device. Such wafer level integration and packaging processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
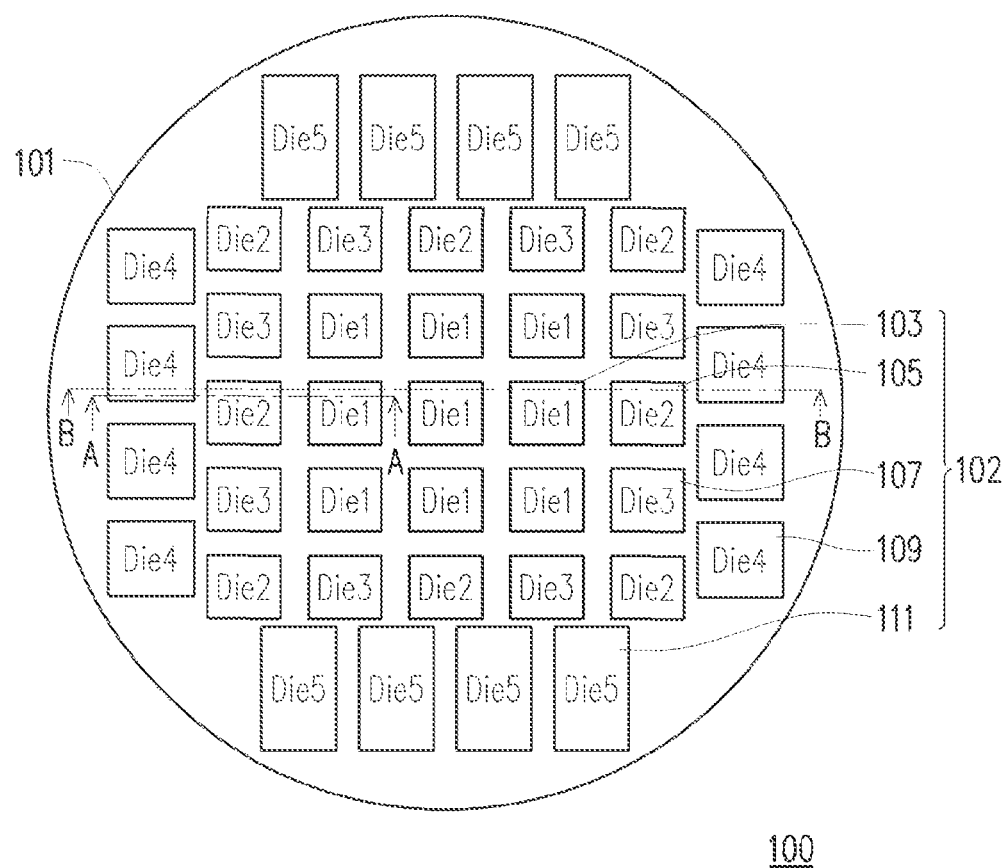
FIGS. 1A-1B illustrate a semiconductor wafer comprising a plurality of different types of semiconductor devices, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated go degrees or at other orientations) and the spatially relative descriptors used herein may likewise be interpreted accordingly.

Embodiments will now be described with respect to specific embodiments which integrate a plurality of functional dies of different types in a single silicon wafer and integrated redistribution and integrated fan out technology in order to provide a system-on-silicon wafer (SoSW) device with high performance in a compact and low cost structure. However, the embodiments described herein may be applied in a wide variety of structures and methods, and all such structures and methods are fully intended to be included within the scope of the embodiments.

Figure 1B:
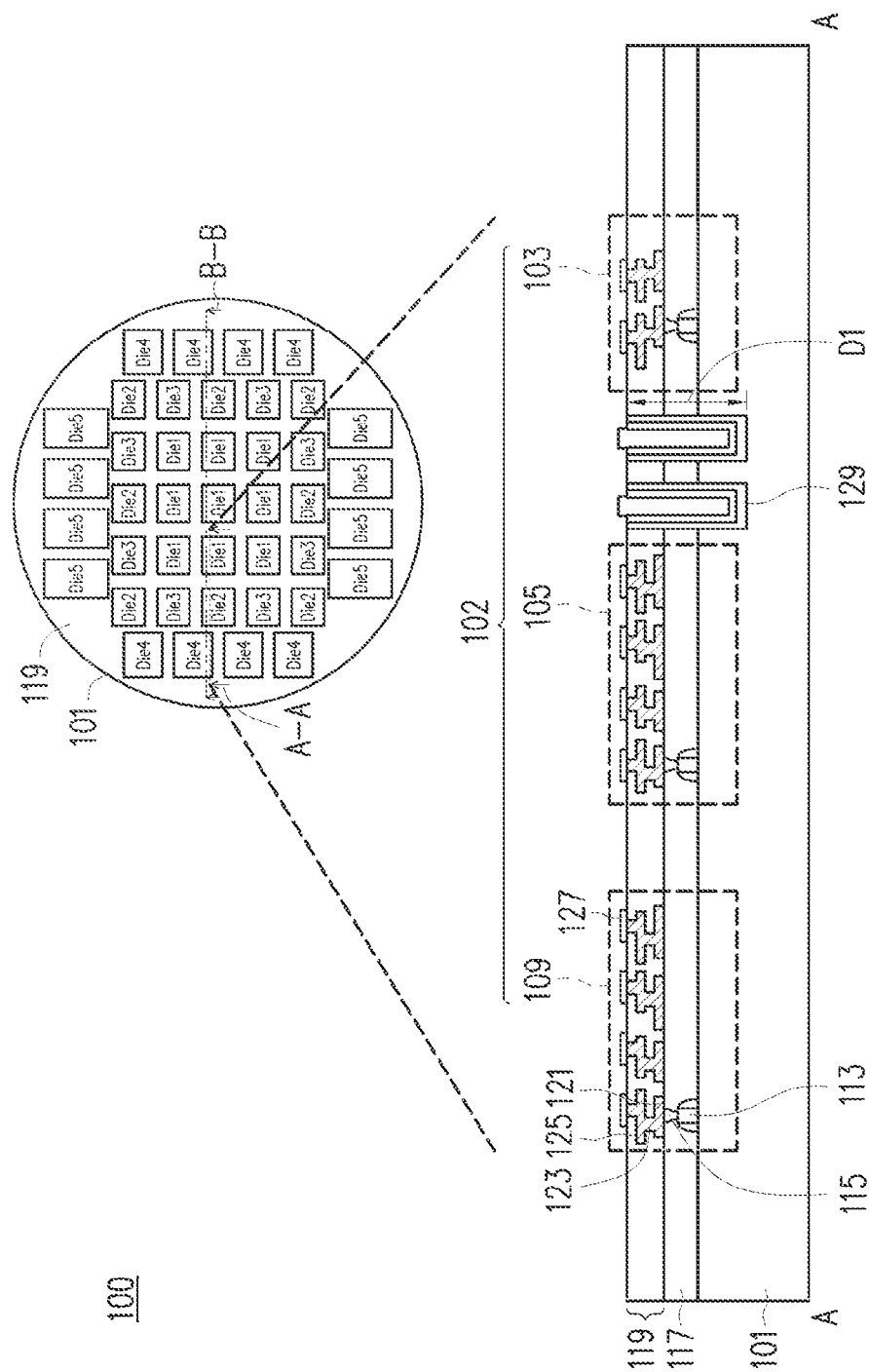

With reference now to FIGS. 1A-1B, a wafer 100 is illustrated with a plurality of different types of functional dies 102 formed within and over the wafer 100 (with FIG. 1B illustrating a cross-sectional view of FIG. 1A along a first cutline A-A). Each type of the functional dies 102 provides a distinct and different function, has a distinct and different pattern size (e.g., footprint), and/or has a unique wafer location. According to some embodiments, the locations of the functional dies 102 may be arranged according to the functions of the types of dies and/or according to relative locations and/or functions of adjacent dies. Examples of the functional dies 102 include, but are not limited to, active devices such as, digital cores (e.g., digital signal processing (DSP) core), central processing units (CPU), graphics processing units (GPU), field programmable gate array (FPGA), artificial intelligence (AI), accelerators, input/output (I/O) dies, static random access memory (SRAM), and passive devices such as, integrated passive device (IPD) (e.g., inductors (L), capacitors (C), resistors, transformers, and the like), low dropout (LDO) components, integrated voltage regulator (IVR) components, or the like).

In a particular embodiment, the wafer 100 comprises five different types of functional dies 102. For example, first dies 103 may perform a first function (e.g., digital core), second dies 105 may perform a second function (e.g., SRAM), third dies 107 may perform a third function (e.g., FPGA), fourth dies log may perform a fourth function (e.g., I/O interface), and fifth dies 111 may perform a fifth function (e.g., accelerators). However, any suitable number and any suitable type of the functional dies 102 may be used.

FIG. 1A further illustrates a first cutline A-A through a first portion of the wafer 100 and a second cutline B-B through the entirety of the wafer 100 including the first portion. In particular, FIG. 1A illustrates the first cutline A-A is cut through three adjacent dies including one of the first dies 103, one of the second dies 105, and one of the fourth dies log. The second cutline B-B is cut through an entire row of functional dies 102 including those dies cut through by the first cutline A-A. The second cutline B-B cuts through seven adjacent dies including three of the first dies 103, two of the second dies 105, and two of the fourth dies log. The first cutline A-A and the second cutline B-B will be referenced with the following figures to illustrate cross-sectional views of the semiconductor wafer, according to some embodiments.

Additionally, wafer 101 illustrates a particular embodiment with a particular combination of dies, and these dies are used as examples for discussion purposes only with regard to different sizes of different functional dies 102 and formations of different interconnects between the different dies with regard to functions and/or relative locations to one another. It is to be understood that any of the functional dies 102 may be arranged in any suitable locations, and any suitable interconnects may be formed between any suitable combinations of the functional dies 102, as will be clear with the following discussion and figures.

FIG. 1B illustrates the wafer 100 and a magnified view of a cross-section taken through the first cutline A-A, according to an embodiment. As illustrated, the wafer 100 comprises a semiconductor substrate 101, one of the first dies 103, one of the second dies 105, one of the fourth dies log, and intermediate devices 129. The semiconductor substrate 101 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The functional dies 102 comprise a wide variety of active and passive devices 113 such as capacitors, resistors, inductors and the like that may be used to generate the desired structural and functional requirements of the design for each of the functional dies 102. For example, active devices and passive devices may be formed using any suitable methods either within or else on the semiconductor substrate 101.

In some embodiments the devices 113 may be active devices (e.g., transistors, diodes, etc.), capacitors, resistors, etc. In an embodiment, the devices 113 may be formed at a front surface of the semiconductor substrate 101 within each of the patterns of the functional dies 102. Initially, circuit patterns for each type of the functional dies 102 may be patterned into and/or over the semiconductor substrate 101 using distinct circuit mask sets for each type of die, and for each separate manufacturing process (e.g., etching, implantations, plating, etc.) for the functional dies 102. Each type of functional dies 102 and the corresponding mask sets for each type may be a different size from the other functional dies 102 and their corresponding mask sets. However different types of functional dies 102 and their corresponding mask sets may be the same size. Each of the functional dies 102 may be patterned in any location on the wafer using the corresponding mask set.

For example, in one representative manufacturing process which utilizes a photosensitive material such as a photomask, the photosensitive material is initially placed to cover the surface of the semiconductor substrate 101. Once in place, a first circuit mask is utilized to image the photosensitive material, and the first circuit mask is used to pattern the photosensitive material for the devices 113 that are to be manufactured as part of the first dies 103, such as by imaging the region of one of the first dies 103 and then imaging the region for a second one of the first dies 103 until the photosensitive material over each region for the first dies 103 has been imaged. Additionally, a second circuit mask is utilized to image the photosensitive material for the devices 113 that are to be manufactured as part of the second dies 105, a third circuit mask is utilized to image the photosensitive material for the devices 113 that are to be manufactured as part of the third dies 107, and so forth. At each stage of the manufacturing processes for the wafer 100 when a photosensitive material is patterned, different circuit masks may be utilized to separately manufacture the devices for the separate dies. As such, each of the different dies may be manufactured on the same semiconductor wafer 100.

Additionally, scribe regions may be formed in between the different functional dies 102. For example, a portion of the semiconductor substrate 101 is left without active devices (although other devices such as test devices or the like may be formed in the scribe regions) by simply not imaging patterns into the region between the different functional dies 102. As such, the scribe regions act as a way of separating the different functional dies 102 from each other.

Once the active devices and/or the passive devices have been formed, an inter-layer dielectric (ILD) 117 is formed over the front surface of the semiconductor substrate 101. The ILD 117 surrounds and may cover the devices 113. The ILD 117 may include one or more dielectric layers formed of materials such as Phospho-Silicate Glass (PSG), Boro-Silicate Glass (BSG), Boron-Doped Phospho-Silicate Glass (BPSG), undoped Silicate Glass (USG), or the like.

Conductive plugs 115 extend through the ILD 117 to electrically and physically couple the devices 113. For example, when the devices 113 are transistors, the conductive plugs 115 may couple the gates and source/drain regions of the transistors. The conductive plugs 115 may be formed of tungsten, cobalt, nickel, copper, silver, gold, aluminum, the like, or combinations thereof. An interconnect structure 119 is formed over the ILD 117 and conductive plugs 115. The interconnect structure 119 interconnects the devices 113 to form a functional device (e.g., an integrated circuit). The interconnect structure 119 may be formed, for example, by forming metallization patterns in dielectric layers on the ILD 117. The metallization patterns include metal lines 121 and vias 123 formed in one or more low-k dielectric layers 125. The metallization patterns of the interconnect structure 119 are electrically coupled to the devices 113 by the conductive plugs 115. The functional dies 102 further include pads 127, such as aluminum pads, to which external connections are made. The pads 127 are on the active side of the functional dies 102, such as in and/or on the interconnect structure 119.

FIG. 1B further illustrates that the wafer 100 may further comprise one or more intermediate devices 129 which may be formed in and/or over the semiconductor substrate 101 between adjacent dies of the functional dies 102. The intermediate devices 129 may be any suitable active device (e.g., diodes, transistors, operational amplifiers, rectifiers, combinations, or the like) and/or passive device (e.g., capacitors, inductors, resistors, combinations or the like). For example, a deep trench capacitor may be formed as one of the intermediate devices 129 within the semiconductor substrate 101 between the first die 103 and the second die 105, as illustrated in FIG. 1B. However, any suitable active devices and/or passive devices may be utilized as the one or more intermediate devices 129.

According to some embodiments, the intermediate device 129 may be formed using any suitable methods within or on the semiconductor substrate 101. For example, a deep-trench capacitor may be formed by initially forming one or more trenches into the semiconductor substrate 101. The trenches may be formed by any suitable process such as, photolithographic mask and etching process, laser drilling, combinations, or the like. For example, a photoresist may be formed and patterned over the interconnect structure 119, and one or more etching processes (e.g., dry etching and/or wet etching) and/or laser drilling may be utilized to remove those portions of the low-k dielectric layers 125, the ILD 117, and the semiconductor substrate 101 where the deep-trench capacitors are desired. According to some embodiments, the one or more trenches are formed having a first depth D1 of between about 1 µm and about 15 µm. However, any suitable depths may be used.

Once the one or more trenches have been formed, first electrodes of the deep trench capacitors may be formed by depositing a first conductive electrode material into the one or more trenches. For example, a seed layer may be formed in the trenches and over the interconnect structure 119 followed by a plating process (e.g., electrical plating or electroless plating) of the first conductive electrode material. However any suitable process may be used. The first conductive electrode material may be one or more layers of a conductive material such as doped silicon, polysilicon, copper, tungsten, aluminum alloy, copper alloy, the like, combinations thereof, or another conductive material. The first conductive electrode material may be formed having a thickness between about 0.05 µm and about 1 µm. However, any suitable thickness may be used.

Once the first electrode has been formed, dielectric layers may be formed over the first conductive electrode material within the one or more trenches. The dielectric layers may include high-K dielectric materials, an oxide, a nitride, or the like, or combinations or multiple layers thereof, and be formed using any suitable deposition process, such as a CVD process. Excess portions of the dielectric layer may be removed using, for example, a suitable photolithographic mask and etching process. For example, a photoresist may be formed and patterned over the dielectric layer, and one or more etching processes (e.g., a wet etch process or a dry etch process) are utilized to remove excess portions of the dielectric layer. The dielectric layer may be formed having a thickness between about 1 nm and about 100 nm. However, any suitable thickness may be used.

Once the dielectric layer has been formed over the first conductive electrode material, a second conductive electrode material may be formed over the dielectric layer in the one or more trenches to form a second capacitor electrode. The second conductive electrode material may be deposited using any of the materials and processes suitable for forming the first capacitor electrode and the second capacitor electrode may be formed to a thickness suitable for forming the first capacitor electrode. Once formed, excess portions of the second conductive electrode material may be removed using a similar process for removing the excess materials of the first capacitor electrode. The above described process for forming deep-trench capacitors is merely one method of forming the deep-trench capacitors, and other methods are also fully intended to be included within the scope of the embodiments. Further, although the deep trench capacitor has been used as an example of the one or more intermediate devices 129, it is to be understood that any suitable active device and/or passive device may be formed as the one or more intermediate devices 129.

Figure 2:
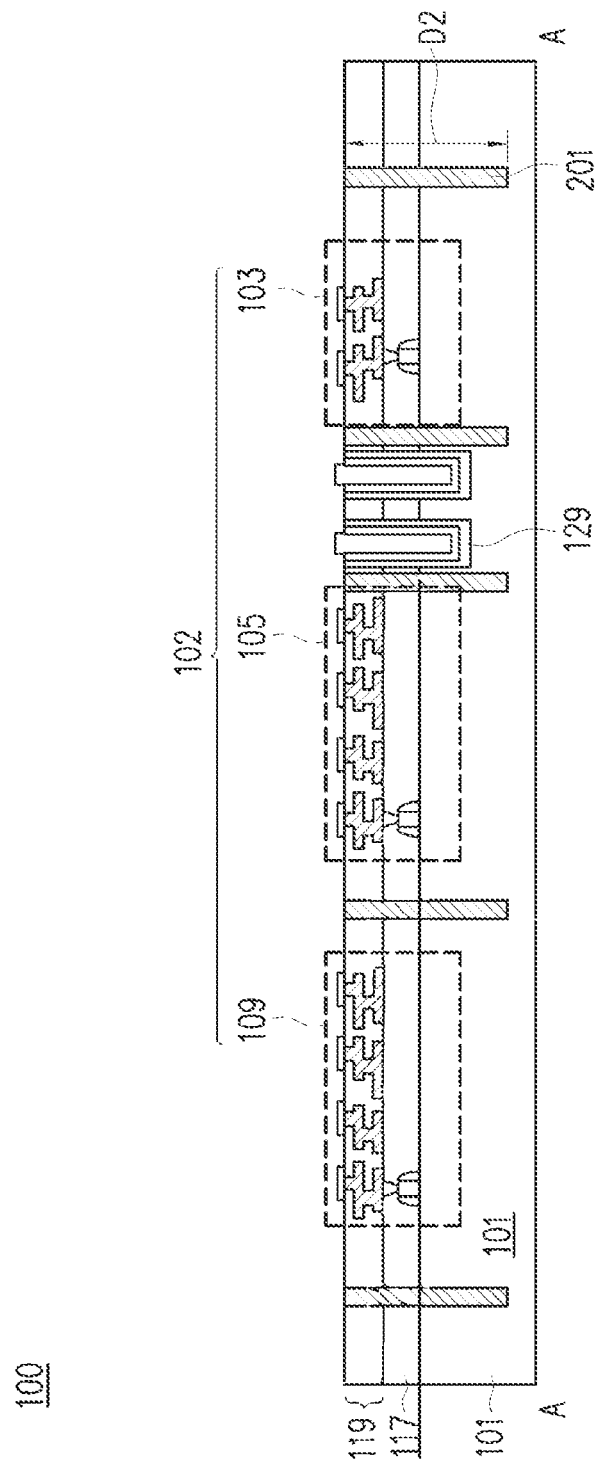
FIG. 2 illustrates the formation of through substrate vias in the semiconductor wafer, in accordance with some embodiments.

Turning to FIG. 2, this figure illustrates the formation of through substrate vias (TSVs) 201 in the wafer 100, according to an embodiment. The through substrate vias 201 may be formed by initially forming openings through the interconnect structure 119, the ILD 117 and into the semiconductor substrate 101. According to some embodiments, the openings may be formed using a laser drilling method, by which a laser is directed towards those portions of the 119 which are desired to be removed. During the laser drilling method, the drill energy may be in a range from 0.1 mJ to about 60 mJ, and a drill angle of about 0 degree (perpendicular to the wafer 100) to about 85 degrees to normal of the wafer 100.

In another embodiment, the openings may be patterned through the interconnect structure 119, the ILD 117 and into the semiconductor substrate 101 by initially applying a photoresist (not shown) to the interconnect structure 119 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portions of the interconnect structure 119, the ILD 117 and the semiconductor substrate 101 are removed with, e.g., a dry etch process. However, any other suitable method for openings for the through substrate vias 201 may be utilized. In some embodiments, a cleaning process is performed after forming the openings in order to remove any residue (e.g., from the laser drilling process). According to some embodiments, the openings for the through substrate vias 201 may be formed to a second depth D2 of between about 10 µm and about 700 µm, such as about 100 µm. However, any suitable depths may be used.

Once the openings for the through substrate vias 201 have been formed, the openings may be filled with, e.g., a barrier layer (not shown) and a conductive material. The barrier layer may comprise a conductive material such as titanium nitride, although other materials, such as tantalum nitride, titanium, a dielectric, or the like may be utilized. The barrier layer may be formed using a chemical vapor deposition (CVD) process, such as plasma enhanced chemical vapor deposition (PECVD). However, other processes, such as sputtering or metal organic chemical vapor deposition (MOCVD), may be used. The barrier layer may be formed so as to contour to the underlying shape of the opening for the through substrate vias 201.

The conductive material may comprise copper, although other suitable materials such as aluminum, alloys, doped polysilicon, combinations thereof, and the like, may be utilized. The conductive material may be formed by depositing a seed layer and then electroplating copper onto the seed layer, filling and overfilling the openings for the through substrate vias 201. Once the openings for the through substrate vias 201 have been filled, excess material of the barrier layer and excess conductive material outside of the openings may be removed through a grinding process such as chemical mechanical polishing (CMP), although any suitable removal process may be used. The through substrate vias 201 may be formed in a TSV first process or in a TSV middle process.

Additionally, while the above description of the forming of the openings for the through substrate vias 201 is described with respect to forming the openings of the through substrate vias 201 after formation of the interconnect structure 119, this is intended to be illustrative and is not intended to be limiting. Rather, the openings for the through substrate vias 201 may be formed at any point during the manufacturing process. For example, the openings for the through substrate vias 201 may be formed in the semiconductor substrate 101 prior to formation of the interconnect structure 119, or after formation of any suitable layer over the semiconductor substrate 101. Any suitable timing for forming the openings and the conductive material may be utilized and all such timings are fully intended to be included within the scope of the embodiments.

Figure 3:
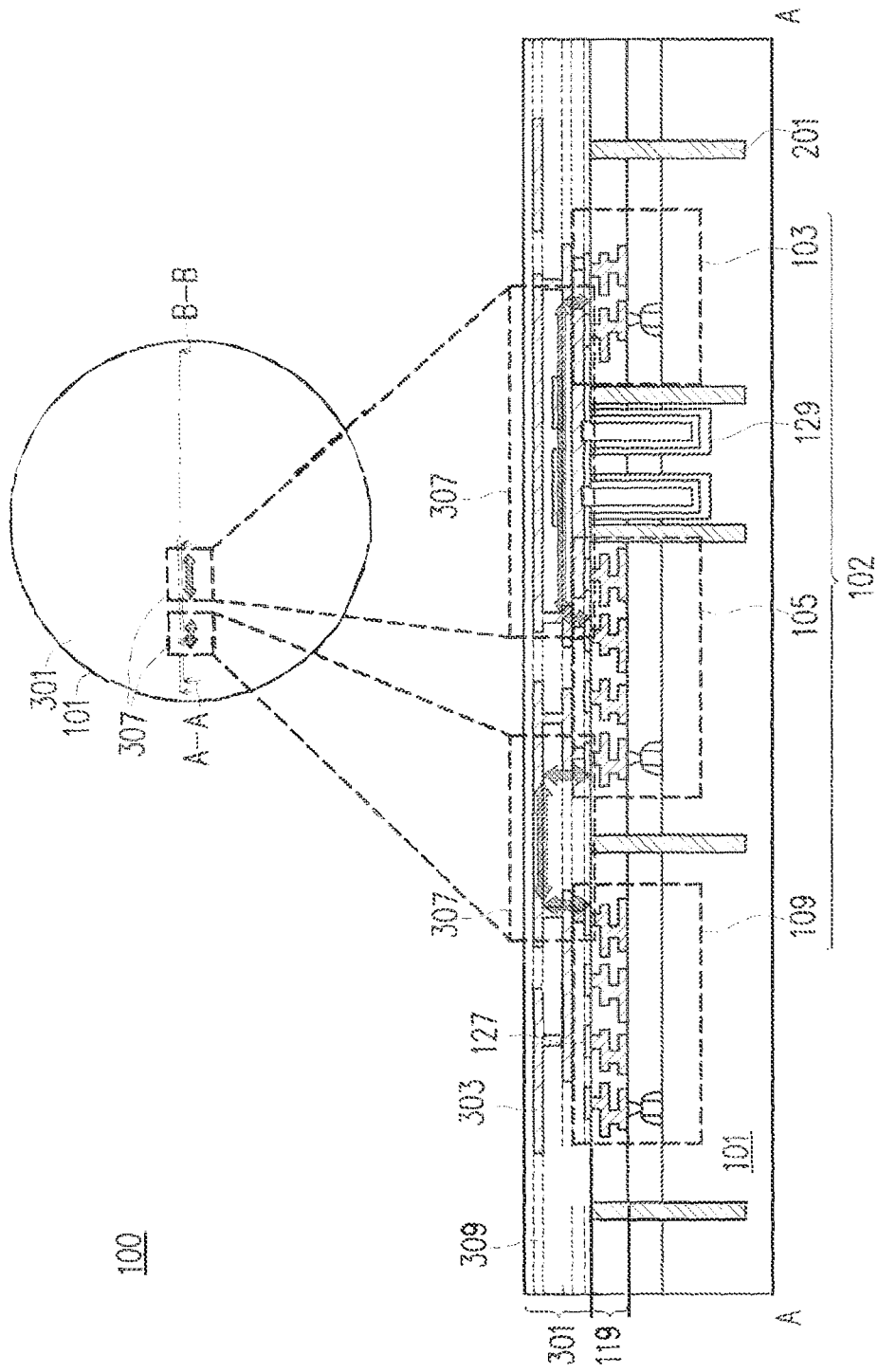
FIG. 3 illustrates a formation of a first metallization structure over the semiconductor wafer, in accordance with some embodiments.

FIG. 3 illustrates a formation of a first metallization structure 301, according to some embodiments. Once the through substrate vias 201 have been formed, the first metallization structure 301 is formed over the interconnect structure 119 in order to interconnect the functional dies 201 without singulating the functional dies 201 from each other. The first metallization structure 301 provides local interconnects 307 between the functional dies 102, the intermediate devices 129, and/or the through substrate vias 201 and provides the functional dies 102 and/or the through substrate vias 201 electrical connectivity to overlying structures.

In an embodiment the first metallization structure 301 comprises a series of first conductive layers 303 embedded within a first series of dielectric layers 309. In an embodiment, a first layer of the series of dielectric layers 309 is formed over the interconnect structure 119 including the exposed surfaces of the functional dies 102 and the intermediate devices 129. The first layer in the series of dielectric layers 309 may be formed using one or more materials such as Phospho-Silicate Glass (PSG), Boro-Silicate Glass (BSG), Boron-Doped Phospho-Silicate Glass (BPSG), undoped Silicate Glass (USG), or the like. The first layer of the series of dielectric layers 309 may be placed using, e.g., a spin-coating process, although any suitable method such as chemical vapor deposition (CVD), physical vapor deposition (PVD), atomic layer deposition (ALD), combinations of these, or the like may be used.

After the first layer of the series of dielectric layers 309 has been formed, openings (e.g., via openings and/or trench openings) may be made through the first layer of the series of dielectric layers 309 by removing portions of the first layer of the series of dielectric layers 309 to form openings for vias and trenches. The openings may be formed using one or more suitable photolithographic masking and etching processes, although any suitable process or processes may be used to pattern the first layer of the series of dielectric layers 309.

Additionally, because the first metallization structure 301 is used to interconnect some of the functional dies 102, multiple photolithographic masks may be used with multiple exposures, some of the exposures overlapping, in order to form the patterns for the first layer of the series of dielectric layers 309. Further, in order to help integrate the multiple exposures, the patterns for the multiple photolithographic masks may be stitched together to make sure that patterns which extend from one of the multiple photolithographic masks to another of the multiple photolithographic masks (e.g., a conductive line extending from over the first dies 103 to over the second dies 105) are adequately integrated. However, any suitable process of making sure that consistent patterns are formed using multiple photolithographic masks may be used, and all such processes are fully intended to be included within the scope of the embodiments.

Once the first layer of the series of dielectric layers 309 has been formed and patterned, the openings may be filled with conductive material to form the first conductive layers 303, such as conductive vias and conductive trenches. In an embodiment the conductive material may be a material such as copper formed through a deposition process such as an electroplating process, although any suitable deposition process and material may be used to fill and/or overfill the openings within the first layer of the series of dielectric layers 309. Once the openings within the first layer of the series of dielectric layers 309 have been filled and/or overfilled, excess material may be removed using a planarization process such as, for example, a chemical mechanical polishing process. However, any suitable planarization process may be utilized.

Once the first layer of the series of first conductive layers 303 has been formed, a second layer of the series of dielectric layers 309 is formed over the first layer of the series of first conductive layers 303. The second layer of the series of dielectric layers 309 may be formed using any of the materials and methods used to form the first layer of the series of dielectric layers 309.

Once the second layer of the series of dielectric layers 309 has been formed, further layers of the series of first conductive layers 303 and further layers of the series of dielectric layers 309 may be formed by repeating steps similar to those used to form the first layer of the series of dielectric layers 309 and the first layer of the series of first conductive layers 303, respectively. These steps may be repeated as desired in order to electrically connect each of the layers of the series of first conductive layers 303 to an underlying layer of the series of first conductive layers 303, and may be repeated as often as desired until an uppermost layer of the series of first conductive layers 303 and an uppermost layer of the series of dielectric layers 309 has been formed. Furthermore, the layers of the series of first conductive layers 303 may also be referred to herein as metallization layers (e.g., first metallization layer, second metallization layer, third metallization layer, etc.).

In an embodiment, the formation of the series of first conductive layers 303 and the series of dielectric layers 309 may be continued until the first metallization structure 301 has a desired number of metallization layers, such as two metallization layers or three metallization layers, although any suitable number of individual metallization layers may be utilized. Furthermore, the first metallization structure 301 may also be referred to herein as a front-side metallization layer of the wafer 100.

According to some embodiments, the first metallization structure 301 may comprise local interconnects 307 which electrically and functionally connect adjacent ones of the functional dies 102 and the integrated devices 129. For example, one local interconnect 307 may be used to interconnect the second die 105 to adjacent devices, such as the fourth die log or the first die 103. Each of the local interconnects 307 comprises a set of conductive features in the series of first conductive layers 303 that electrically connect pads 127 of adjacent functional dies 102. For example, FIG. 3 illustrates two of the local interconnects 307. One of the local interconnects 307 comprises a set of conductive features of the first metallization layer and of the second metallization layer of the series of first conductive layers 303 and connects a pad 127 of the fourth die 109 to a pad 127 of the second die 105. The other one of the local interconnects 307 comprises another set of conductive features of the first metallization layer and connects a pad 127 of the second die 105 to a pad 127 of the first die 103.

Additionally, in some embodiments, the local interconnects 307 may be formed to connect the intermediate devices 129 to one another and/or connect a pad 127 of a functional die 102 to one or more of the intermediate devices 129. As such, the local interconnects 307 may electrically couple two or more of the functional dies 102 to one another and may electrically couple one or more of the intermediate devices 129 to one or more of the functional dies 102.

Figure 4:
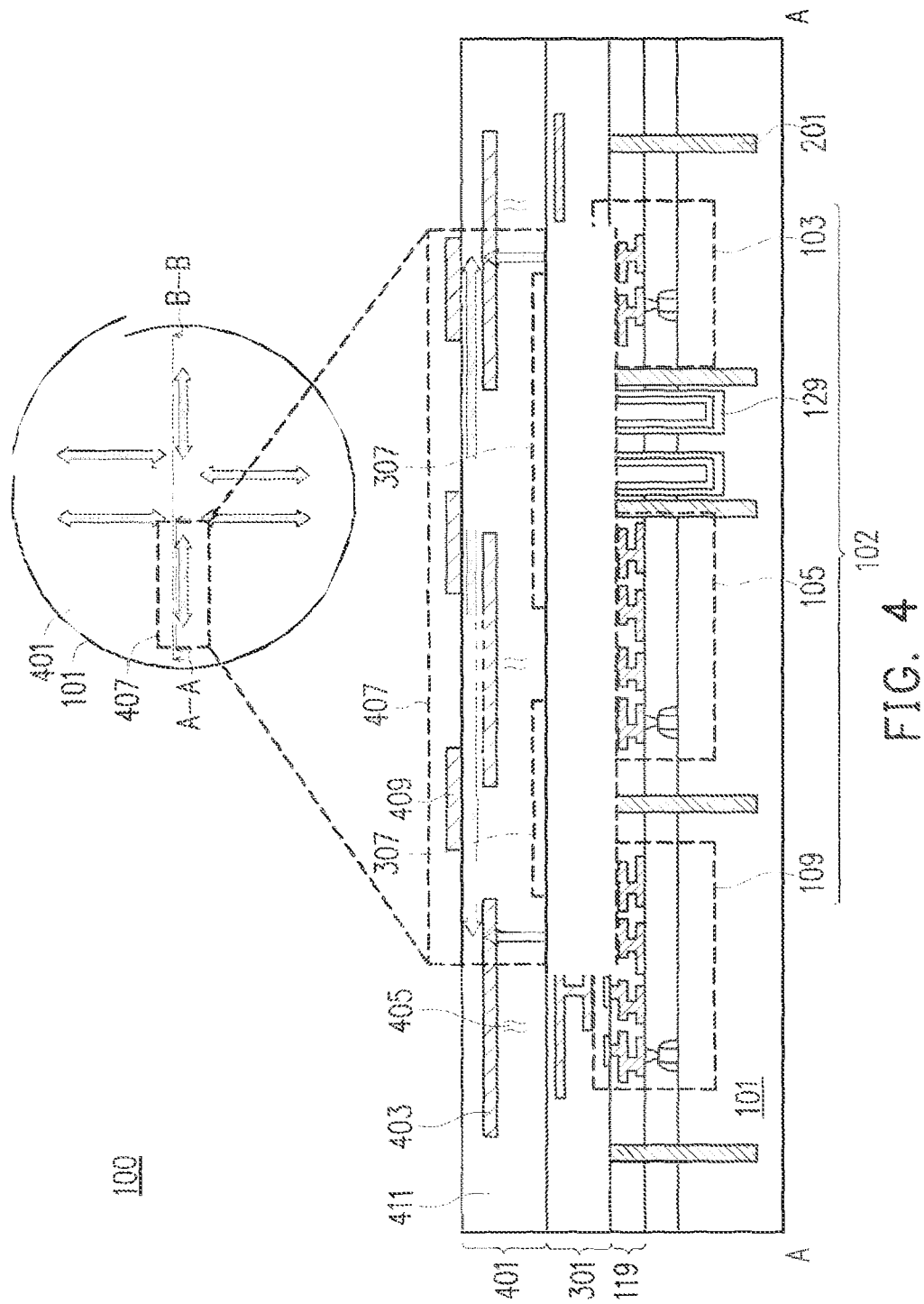
FIG. 4 illustrates the formation of a second metallization structure over the first metallization structure, in accordance with some embodiments.

FIG. 4 illustrates the formation of a second metallization structure 401 over the first metallization structure 301. The second metallization structure 401 may be formed with a stack of metallization layers comprising a series of second conductive layers 403 embedded in a second series of dielectric layers 411. The individual layers of the second conductive layers 403 and the second series of dielectric layers 411 of the second metallization structure 401 are not separately illustrated but are instead represented by the symbol 405.

The second metallization structure 401 may be formed using similar processes and similar materials as the first metallization structure 301 described above with respect to FIG. 3. For example, a first dielectric material may be deposited, openings may be formed within the first dielectric material, and the openings may be filled with conductive material to form conductive vias and conductive lines. Further metallization layers of the second metallization structure 401 may be formed as desired in order to electrically connect the series of second conductive layers 403 to an underlying layer of the series of second conductive layers 403, and may be repeated as often as desired until an uppermost metallization layer of the second metallization structure 401 has been formed. The second metallization structure 401 may comprise many metallization layers such as ten metallization layers or even more. The metallization layers of the second metallization structure 401 may be referred to herein as a fourth metallization layer, a fifth metallization layer . . . a thirteenth metallization layer, etc.

The series of second conductive layers 403 and the second series of dielectric layers 411 of the second metallization structure 401 may be formed using any of the materials and processes suitable for forming the series of first conductive layers 303 and the series of dielectric layers 309 of the first metallization structure 301, respectively. The conductive material used to form the series of second conductive layers 403 may be the same conductive material used to form the series of first conductive layers 303, although the conductive materials may also be different. According to some embodiments, the series of second conductive layers 403 may be formed to a thickness larger than a thickness of the first metallization structure 301, such as a thickness of between about 0.3 µm and about 5 µm, such as about 3 µm. However, any suitable thickness may be used.

The second metallization structure 401 in conjunction with portions of the first metallization structure 301 provides semi-global interconnects 407 and/or global interconnects (not shown) between the functional dies 102, the intermediate devices 129, and/or the through substrate vias 201 and provides the functional dies 102 and/or through substrate vias 201 electrical connectivity to overlying structures. Each of the semi-global interconnects 407 and/or global interconnects comprises a first set of conductive features and a second set of conductive features in the series of first conductive layers 303 and further comprises a third set of conductive features in the series of second conductive layers 403 that collectively connect pads 127 of two functional dies 102 and/or the through substrate vias 201 that are separated from one another by at least one intervening die. For example, FIG. 4 illustrates six of the semi-global interconnects 407 in the top-down view of the wafer 100 and one of the six semi-global interconnects 407 is illustrated in the cross-sectional view of the wafer 100 through cutline A-A. According to some embodiments, the semi-global interconnect 407 comprises a first set of conductive features of the first metallization structure 301 connected to a pad 127 of the first die 103, a second set of conductive features of the first metallization structure 301 connected to a pad 127 of the fourth die log and a third set of conductive features of the second metallization structure 401 connecting the first set of conductive features to the second set of conductive features. As such, the semi-global interconnect 407 electrically couples the first die 103 to the fourth die log, the first die 103 being separated from the fourth die 109 by the second die 105 in the example illustrated in FIG. 4. However, according to other embodiments, a global interconnect (not shown) may connect two of the functional dies 102 and/or through substrate vias 201 on opposite sides of the wafer 100.

According to some embodiments, one or more intermediate devices 129 may be integrated into the second metallization structure 401. Conductive features in the series of second conductive layers 403 may electrically couple one or more of the intermediate devices 129 to one another. As such, the semi-global interconnect 407 and/or global interconnect may be formed to electrically couple one or more of the intermediate devices 129 between two of the functional dies 102.

Once the second metallization structure 401 has been formed, external contact pads 409 may be formed over and electrically connected to the second metallization structure 401 to provide external connectivity to the functional dies 102, the intermediate devices 129, and/or the through substrate vias 201. The external contact pads 409 may comprise aluminum, but other materials, such as copper, may also be used. The external contact pads 409 may be formed using a deposition process, such as sputtering, to form a layer of material (not shown) and portions of the layer of material may then be removed through a suitable process (such as photolithographic masking and etching) to form the external contact pads 409. However, any other suitable process may be utilized. The external contact pads 409 may be formed to have a thickness of between about 0.5 µm and about 4 µm, such as about 1.45 µm. However, any suitable thickness may be used.

Figure 5:
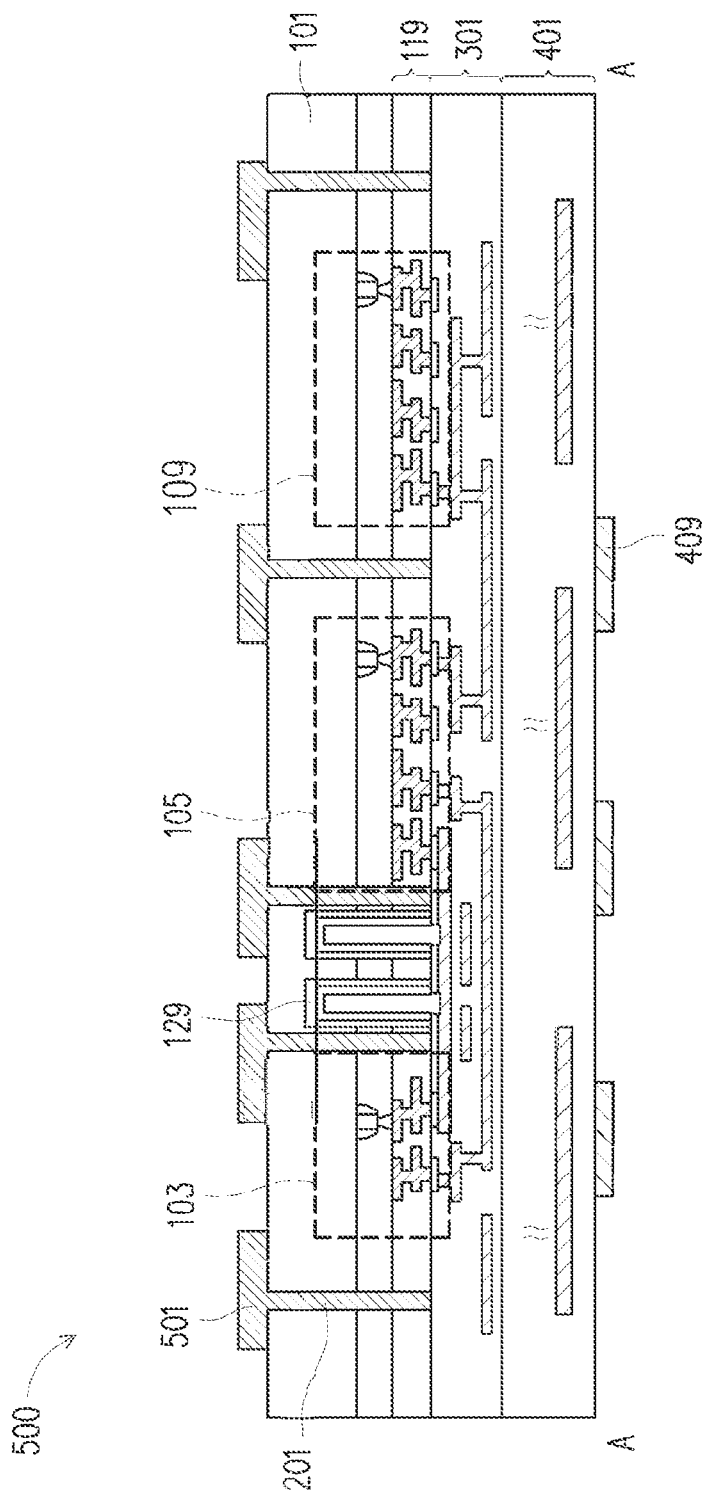
FIG. 5 illustrates a system on wafer (SoW) device, in accordance with some embodiments.

FIG. 5 illustrates a system on silicon wafer (SoSW) device 500 according to some embodiments. FIG. 5 further illustrates a thinning process that is performed on the backside of the semiconductor substrate 101 and a formation of a first backside redistribution line (RDL) 501 over the through substrate vias 201 as intermediate steps in forming the system on silicon wafer device 500.

Once the external contact pads 409 have been formed, the wafer 100 may be flipped over and placed for example on a carrier substrate (not shown) in preparation of further processing. The thinning of the semiconductor substrate 101 may be performed (e.g., using a mechanical grinding or a CMP process) until the conductive material of the through substrate vias 201 has been exposed. In this manner, the through substrate vias 201 may be formed to have a first thickness of between about 50 µm and about 200 µm, such as about 100 µm.

Once the through substrate vias 201 have been exposed, the first backside redistribution line (RDL) 501 are formed, where the first backside RDL 501 may be formed of copper, aluminum, nickel, or the like. The first backside RDL 501 is electrically coupled to the through substrate vias 201 and conductive features of the first metallization structure 301 and/or the second metallization structure 401. In accordance with some embodiments, formation of the first backside RDL 501 includes forming a blanket seed layer (such as a titanium layer and a copper layer on the titanium layer), forming a patterned photoresist (not illustrated), and plating the first backside RDL 501 in openings in the patterned photoresist. The photoresist may be exposed using multiple exposures, so that the first backside RDLs 501 may extend, e.g., over the functional dies 102, with the different patterns being stitched together to form a single pattern that stretches across the semiconductor substrate 101. As such, the first backside RDL 501 provides an arrangement to connect signal lines between the functional dies 102.

Figure 6:
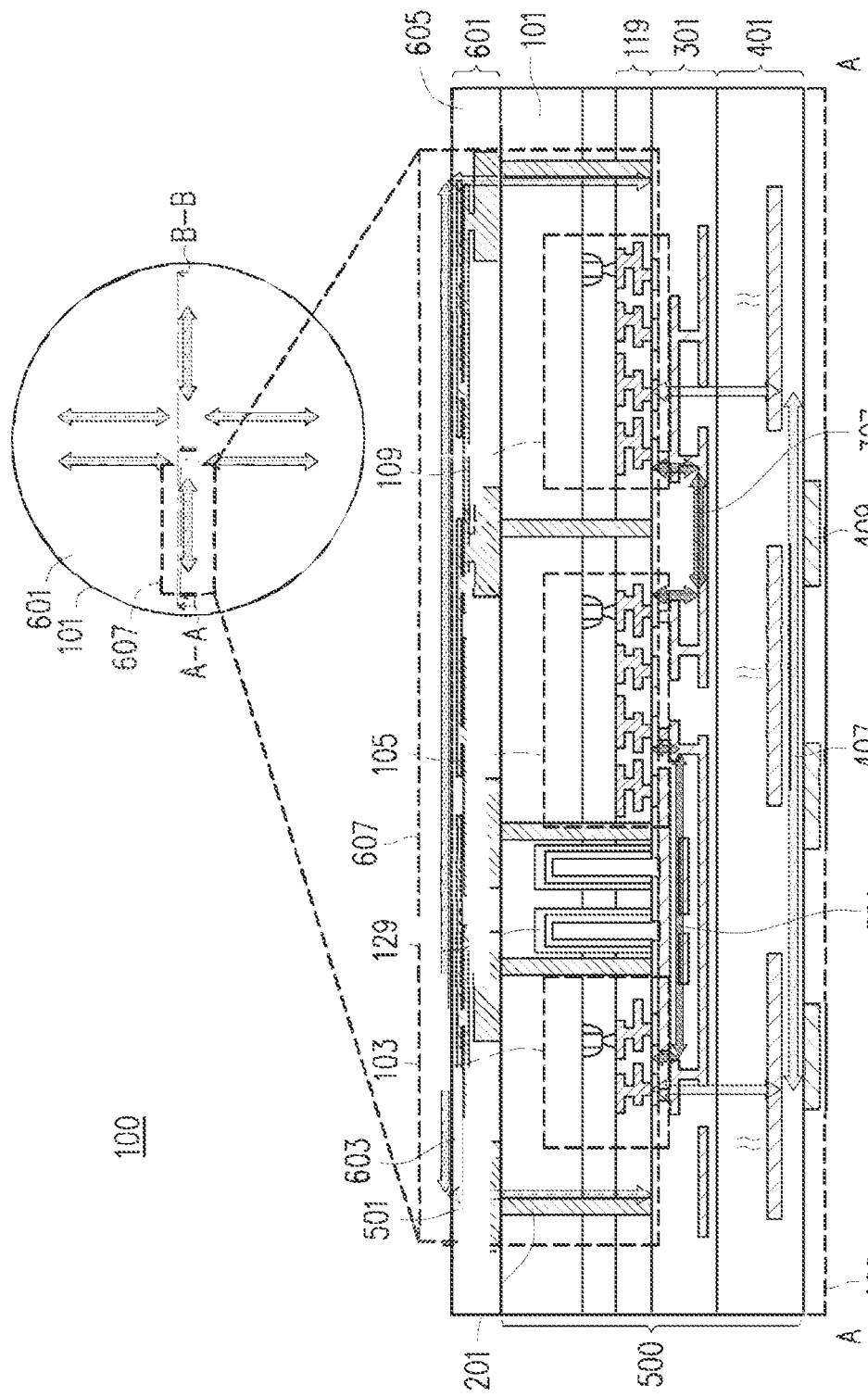
FIG. 6 illustrates a formation of an optional backside redistribution structure over a backside of the system on wafer device, in accordance with some embodiments.

FIG. 6 illustrates a formation of additional backside redistribution layers (e.g., third conductive layers 603) over the first backside RDL 501 in order to form a backside redistribution structure 601, according to some embodiments. The optional backside redistribution structure 601 may be formed to interconnect two or more of the through substrate vias 201 to provide backside interconnects 607. Furthermore, the optional backside redistribution structure 601 may be, for example, a wafer scale integrated fan-out (InFO) redistribution layer.

The third conductive layers 603 may be formed embedded in a third series of dielectric layers 605. For example, the third conductive layers 603 may be formed by initially forming a bottommost dielectric layer of the third series of dielectric layers 605 over and embedding the first backside RDLs 501. The bottommost dielectric layer may be formed using a dielectric material such as curable resins or polyimide coatings (e.g., polyimide (PI), polybenzoxazole (PBO), epoxy films, or the like) deposited via a spin-on technique and then cured using, e.g., a low temperature curing technique. However, any dielectric material may also be used to form the bottommost dielectric layer of the third series of dielectric layers 605.

Once the bottommost dielectric layer of the third series of dielectric layers 605 has been formed, openings may be formed in the bottommost dielectric layer to expose the first backside RDL 501 through the openings. The openings may be formed using any of the methods set forth above for forming openings in the first series of dielectric layers 309, such as a photolithographic masking and etching process. However, any suitable process may be utilized.

Once the first backside RDL 501 is exposed, the third conductive layers 603 are formed over and electrically coupled to the first backside RDL 501. In an embodiment the third conductive layers 603 may be formed with similar materials and using similar methods as the first backside RDL 501. However, any suitable materials and methods may be utilized.

Further layers of the optional backside redistribution structure 601 may be formed as desired in order to electrically connect the series of third conductive layers 603 to an underlying layer of the series of third conductive layers 603, and may be repeated as often as desired until an uppermost redistribution layer of the third redistribution structure 601 has been formed. According to some embodiments, the optional backside redistribution structure 601 may comprise a plurality of redistribution layers such as two or three redistribution layers, although the optional backside redistribution structure 601 may comprise even more than three redistribution layers. The redistribution layers of the optional backside redistribution structure 601 may be referred to herein as a first backside redistribution layer, a second backside redistribution layer . . . , etc.

The optional backside redistribution structure 601 comprises backside interconnects 607 electrically coupling the through substrate vias 201. Each of the backside interconnects 607 comprises a set of conductive features in the series of third conductive layers 603 that connect two of the first backside RDLs 501. As such, the backside interconnects 607 may connect two of the functional dies 102 using the through substrate vias 201 and the first backside RDLs 501. For example, FIG. 6 illustrates six of the backside interconnects 607 in the top-down view of the wafer 100 and one of the six backside interconnects 607 is illustrated in the cross-sectional view of the wafer 100 through cutline A-A. The backside interconnects 607 may further connect the functional dies 102 to one or more of the external contact pads 409. The backside interconnect 607 comprises a set of the series of third conductive layers 603 connecting two of the first backside RDLs 501. Each of the connected first backside RDLs 501, in FIG. 6, are connected to one of the through substrate vias 201.

According to some embodiments, the through substrate vias 201 may be connected to the functional dies 102 via the local interconnects 307 and/or the semi-global interconnects 407. In some embodiments, the through substrate vias 201 may be connected to the external contact pads 409 via the first metallization structure 301 and the second metallization structure 401. As such, the backside interconnects 607 may be formed to electrically couple two or more of the first backside RDL 501 to one another and, in combination with the through substrate vias 201, the local interconnects 307, the semi-global interconnects 407, and/or global interconnects, to electrically couple one or more of the functional dies 102, the intermediate devices 129, and/or the external contact pads 409 to one another as desired.

FIG. 6 further illustrates a section 609 of the wafer 100 including the system on silicon wafer device 500 and the optional backside redistribution structure 601. The section 60g is highlighted with the dashed line and will be referenced in the following discussion with regard to the following figures.

Figure 7:
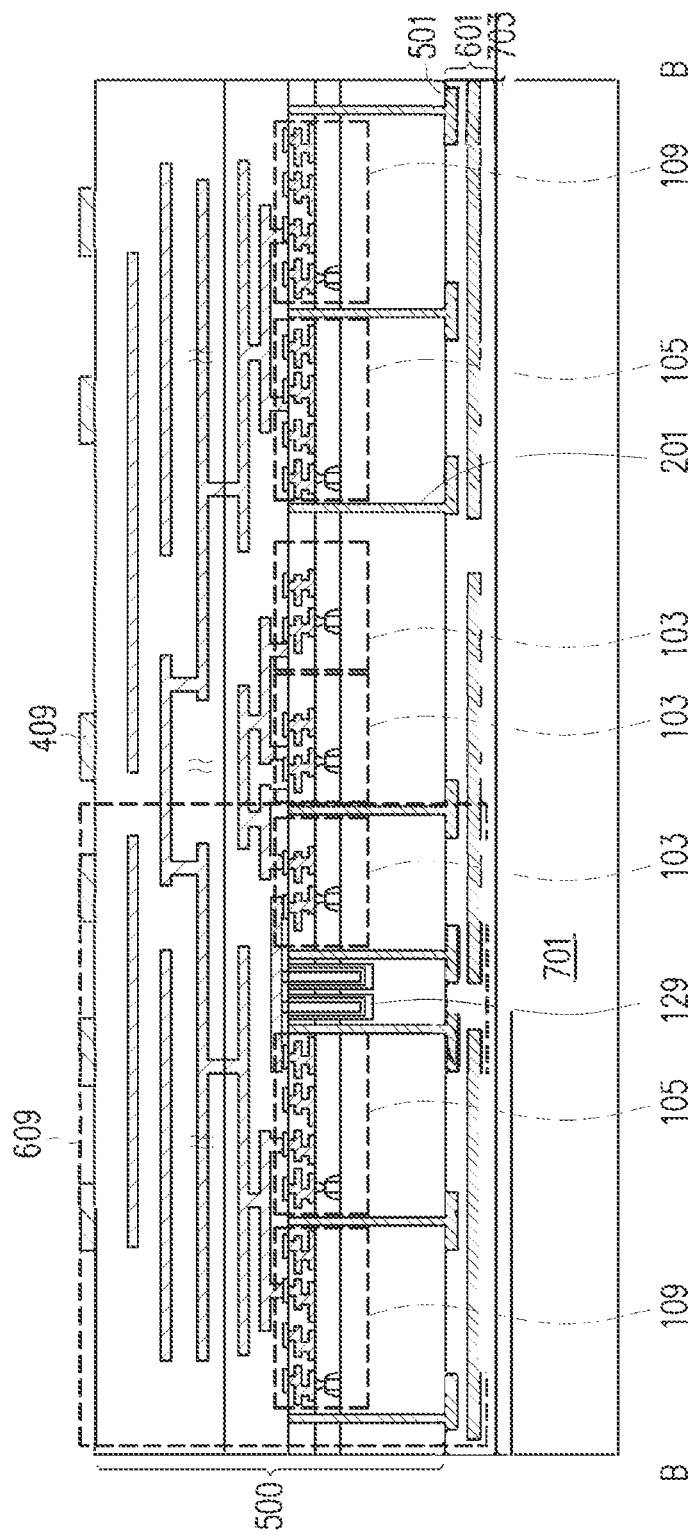
FIG. 7 illustrates an attachment of a thermal module to the system on wafer device, in accordance with some embodiments.

FIG. 7 illustrates a cross-sectional view of the system on silicon wafer device 500 and the optional backside redistribution structure 601 through the second cutline B-B, according to some embodiments. The portion of the system on silicon wafer device 500 illustrated comprises three of the first dies 103, two of the second dies 105, two of the fourth dies log, and one of the intermediate devices 129. FIG. 7 further illustrates the section 609 of FIG. 6 highlighted by the dashed line.

FIG. 7 further illustrates an attachment of the system on silicon wafer device 500 over a thermal module 701, in accordance with some embodiments. The thermal module 701 may be a heat sink, a heat spreader, a cold plate, or the like. However, any suitable heat transfer device may be used. According to some embodiments, the thermal module 701 may be attached to the optional backside redistribution structure 601 using e.g., a thermal interface material (TIM) 703 such as, e.g., a thermal adhesive. According to some embodiments, the thermal interface material (TIM) 703 may be formed of a metal, a metal paste, or a film comprising a thermally conductive material. However, any suitable thermal interface material may be used.

The thermal interface material (TIM) 703 may be dispensed or placed on the back side of the optional backside redistribution structure 601 and the thermal module 701 may be arranged over the optional backside redistribution structure 601 (e.g., via pick and place tool), according to some embodiments. As such, the thermal module 701 is physically and thermally coupled to the optional backside redistribution structure 601. Once the thermal module 701 has been attached, the combined structures may be flipped over for further processing, as illustrated in FIG. 7.

Figure 8:
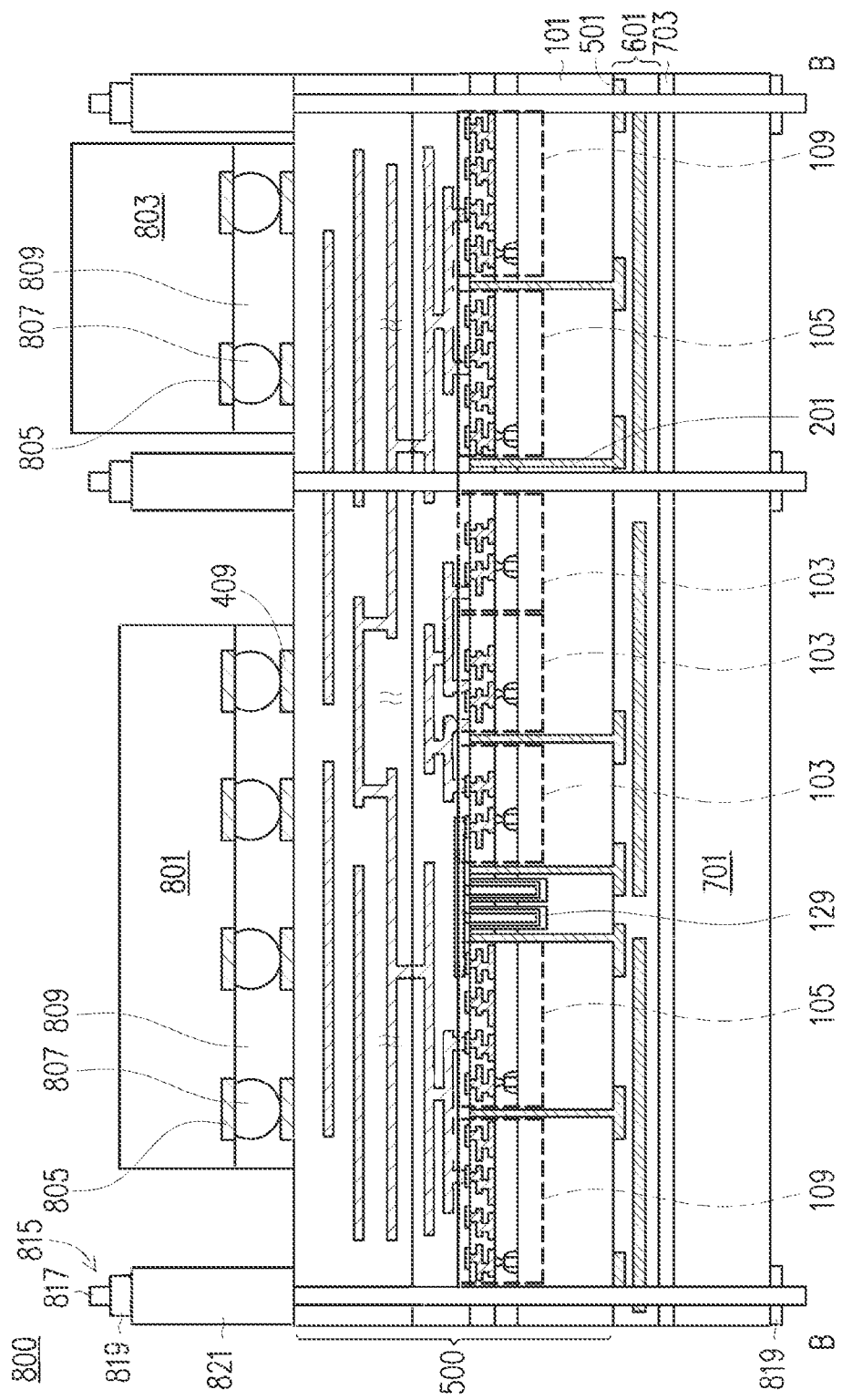
FIG. 8 illustrates the formation of a system on silicon wafer (SoSW) package using the system on wafer device, in accordance with some embodiments.

Continuing to FIG. 8, this figure illustrates the formation of a system on silicon wafer (SoSW) package 800, in accordance with some embodiments. In particular, FIG. 8 illustrates the attachment of a power module 801, a connector 803, and a plurality of screw assemblies to the combined structures of FIG. 7.

Initially, the power module 801 and the connector 803 are attached to the external contact pads 409 at the front side of the system on silicon wafer device 500. The power module 801 and the connector 803 are interfaces for external connection to the system on silicon wafer (SoSW) package 800. The power module 801 and the connector 803 include pads 805, such as aluminum pads, to which external connections are made. The power module 801 and the connector 803 are mounted to the external contact pads 409 using conductive connectors 807, such as solder balls.

The power module 801 provides an electrical and physical interface for modules (not shown) that may be installed subsequent to manufacture of the system on silicon wafer (SoSW) package 800. For example, a user of the system on silicon wafer (SoSW) package 800 may install the modules in the system on silicon wafer (SoSW) package 800 to form completed functional systems with the system on silicon wafer (SoSW) package 800. The type of modules selected for installation depends on the type of functional systems desired. Examples of modules that may be installed in the system on silicon wafer (SoSW) package 800 include memory modules, voltage regulator modules, power supply modules, integrated passive device (IPD) modules, and the like.

The connector 803 provides an electrical and physical interface for the system on silicon wafer (SoSW) package 800 to external systems. For example, when the system on silicon wafer (SoSW) package 800 is installed as part of a larger external system, such as a data center, the connector 803 may be used to couple the system on silicon wafer (SoSW) package 800 to the external system. Examples of the connector 803 include, but are not limited to, receptors for high-speed serial digital interface (SDI) cables, ribbon cables, flexible printed circuits, or the like.

The power module 801 and the connector 803 may be attached to the system on silicon wafer device 500 in a variety of layouts. The layout shown in FIG. 8 is one example. According to some embodiments, each of a plurality of the power modules 801 is mounted directly overlying and electrically coupled to the functional dies 102 corresponding to a computing site. In some embodiments, each of a plurality of the connectors 803 is disposed around the perimeter of the system on silicon wafer (SoSW) package 800, thus increasing the area available for the plurality of the power modules 801. According to some embodiments, the connectors 803 are laterally offset from the functional dies 102 serving as e.g., I/O interface dies. In other embodiments, the connectors 803 directly overly the I/O interface dies. When the power module 801 and the connector 803 are attached to the system on silicon wafer device 500, the conductive connectors 807 are reflowed to physically and electrically couple the pads 805 to the external contact pads 409.

Once the power module 801 and the connector 803 are attached, an underfill 809 is formed to fill the gaps between the power module 801 and the connector 803 and the system on silicon wafer device 500. According to some embodiments, the underfill 809 may be formed by a capillary flow process after the power module 801 and the connector 803 are attached. In other embodiments, the underfill 809 may be formed by a suitable deposition method before the power module 801 and the connector 803 are attached.

Once the underfill 809 has been formed, the screw assemblies 815 may be attached by initially forming bolt holes through the system on silicon wafer device 500 and the optional backside redistribution structure 601 (if provided). The bolt holes may be formed by a drilling process such as laser drilling, mechanical drilling, or the like. In some embodiments, the drilling process is continued through the thermal interface material (TIM) 703 and/or the thermal module 701. In other embodiments, the bolt holes are formed in the thermal module 701 prior to attachment and the thermal interface material (TIM) 703 is dispensed avoiding the bolt holes.

Once the bolt holes have been formed, the screw assemblies 815 may be used to further fasten the thermal module 701 to the system on silicon wafer device 500. The screw assemblies 815 comprise bolts 817, fasteners 819, and mechanical braces 821, according to some embodiments. The bolts 817 are threaded through the bolt holes of the system on silicon wafer device 500, through the bolt holes of the optional backside redistribution structure 601 (if provided), through corresponding bolt holes in the thermal module 701, and through corresponding bolt holes in the mechanical braces 821. The fasteners 819 are threaded onto the bolts 817 and tightened to clamp the system on silicon wafer device 500 between the thermal module 701 and mechanical braces 821. The fasteners 819 may be, e.g., nuts that thread to the bolts 817. The fasteners 819 attach to the bolts 202 at both sides of the resulting system-on-silicon wafer (SoSW) package 800 (e.g., at the side having the thermal module 701 (sometimes referred to as the back side) and at the side having the mechanical braces 821 (sometimes referred to as the front side)).

During fastening, the fasteners 819 are tightened, thereby increasing the mechanical force applied to the system on silicon wafer device 500 by the thermal module 701 and the mechanical braces 821. The mechanical braces 821 are rigid supports that may be formed from a material with a high stiffness, such as a metal, e.g., steel, titanium, cobalt, or the like. The fasteners 819 are tightened until the thermal module 701 exerts a desired amount of pressure on the thermal interface material (TIM) 703. For example, the tightening of the fasteners 819 may be performed with a torque in the range of about 20 N·m to about 30 N·m. However, any suitable torque may be used.

Figure 9A:
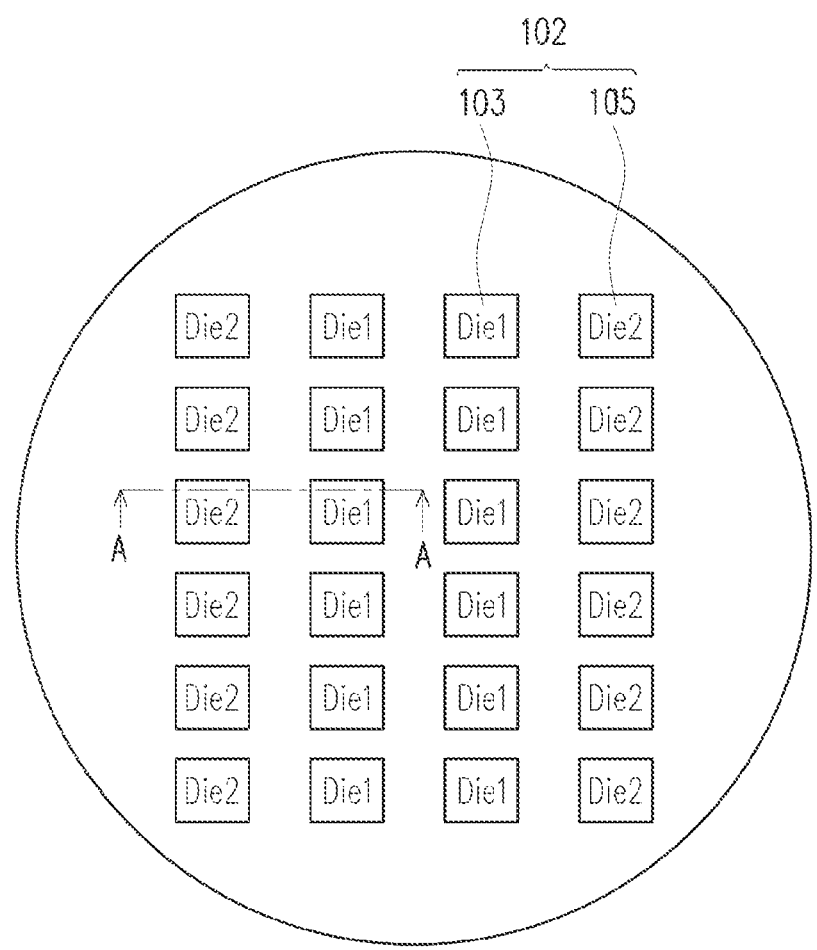
FIGS. 9A-9C illustrate different layouts of semiconductor dies that may be utilized, in accordance with some embodiments.
Figure 9B:
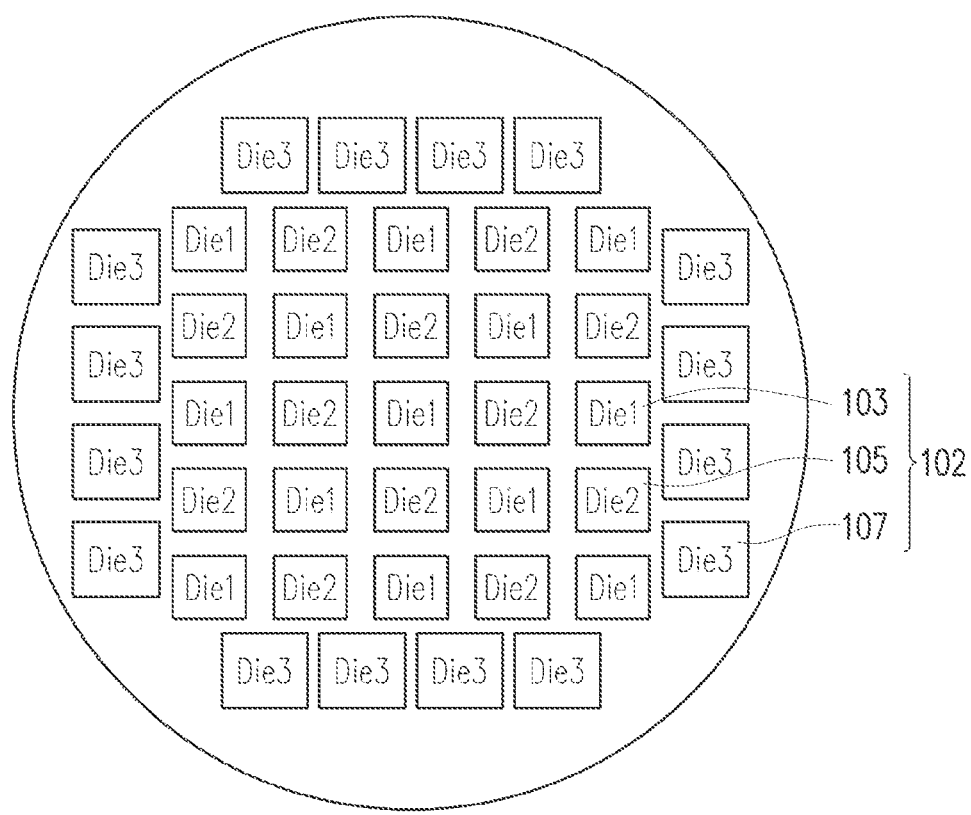
Figure 9C:
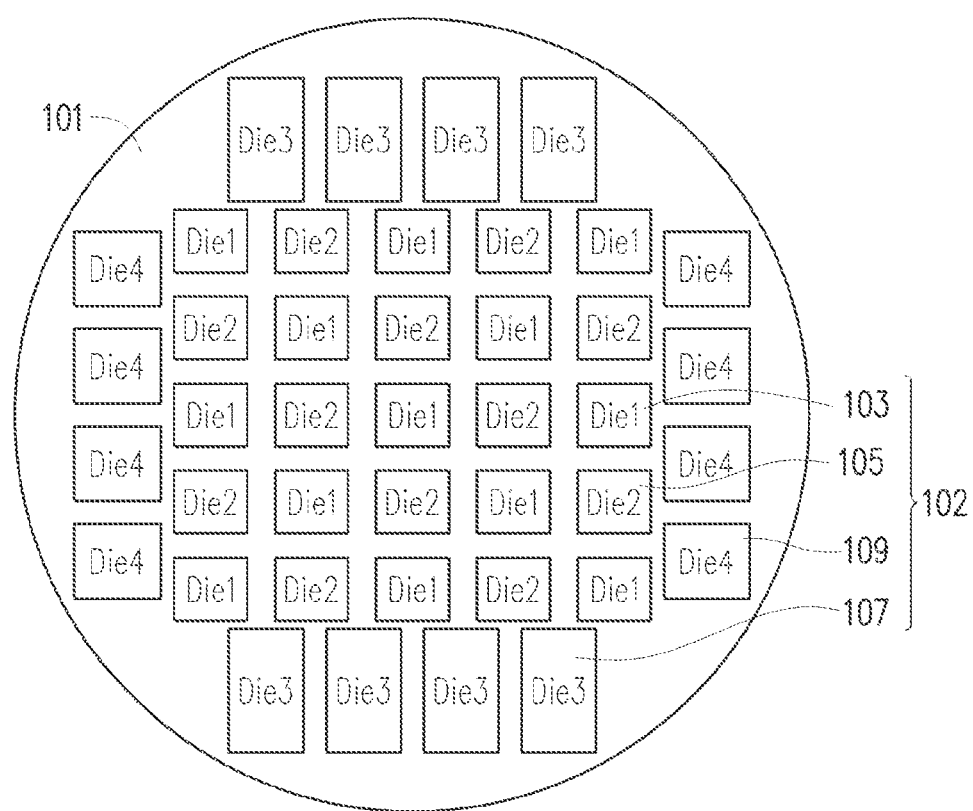

FIGS. 9A-9C illustrate several arrangements of the functional dies 102 in the wafer 100, according to some other embodiments. Although several examples are illustrated in FIGS. 9A-9C, it is to be understood that these examples of different arrangements of the functional dies 102 are not an exhaustive set of the different arrangements that may be formed. Furthermore, the wafer 100 may have any suitable number of functional dies 102 and the functional dies 102 may be any suitable number of different types of functional dies 102 and the functional dies 102 may be arranged in the wafer 100 in any suitable pattern.

In particular, FIG. 9A illustrates the wafer 100 comprising two different types of functional dies 102. For example, the wafer 100 comprises a plurality of the first dies 103 which perform a first function (e.g., digital core) and a plurality of the second dies 105 which perform a second function (e.g., I/O interface). The first dies 103 are arranged adjacent one another within a central area of the wafer 100 and the second dies 105 are arranged in columns near the periphery of the wafer 100 and the columns of the second dies 105 are separated by the first dies 103.

FIG. 9B illustrates the wafer 100 comprising three different types of functional dies 102. For example, the wafer 100 comprises a plurality of the first dies 103 which perform a first function (e.g., digital core), a plurality of the second dies 105 which perform a second function (e.g., SRAM), and a plurality of the third dies 107 which perform a third function (e.g., I/O interface). The first dies 103 and the second dies 105 are arranged in alternating fashion within columns that are adjacent to one another and the columns of the first dies 103 and the second dies 105 are collectively arranged within a central area of the wafer 100. The third dies 107 are arranged in rows and columns near the periphery of the wafer 100 and the rows and columns of the third dies 107 are separated from one another by the columns of the first dies 103 and the second dies 105.

FIG. 9C illustrates the wafer 100 comprising four different types of functional dies 102. For example, the wafer 100 comprises a plurality of the first dies 103 which perform a first function (e.g., digital core), a plurality of the second dies 105 which perform a second function (e.g., SRAM), a plurality of the third dies 107 which perform a third function (e.g., FPGA), and a plurality of the fourth dies 109 which perform a fourth function (e.g., I/O interface). The first dies 103 and the second dies 105 are arranged in alternating fashion within columns that are adjacent to one another and the columns of the first dies 103 and the second dies 105 are collectively arranged within a central area of the wafer 100. The third dies 107 are arranged in rows near the periphery of the wafer 100 and the rows of the third dies 107 are separated from one another by the columns of the first dies 103 and the second dies 105. The fourth dies 109 are arranged in columns near the periphery of the wafer 100 and the columns of the fourth dies 109 are separated from one another by the columns of the first dies 103 and the second dies 105.

Systems, devices and methods of manufacturing a system on silicon wafer (SoSW) device and package are described herein. According to some embodiments, a plurality of functional dies is formed in a silicon wafer and different sets of masks are used to form different types of the functional dies in the silicon wafer. As such, the functional dies of a system comprising different types of functional dies with different pattern sizes and arranged in different wafer locations may be formed in a single silicon wafer. A first redistribution structure is formed over the silicon wafer and provides local interconnects between adjacent dies of the same type and/or of different types. A second redistribution structure may be formed over the first redistribution layer and provides semi-global and/or global interconnects between non-adjacent dies. The semi-global and global interconnects may connect dies of the same type and/or different types. An optional backside redistribution structure may also be formed over a second side of the silicon wafer opposite the first redistribution layer. The optional backside redistribution structure may provide backside interconnects between functional dies of the same type or of different types.

Having the functional dies of different types formed within the same silicon wafer and using the local, semi-global, global, and/or backside redistribution layer interconnects allows for different communication lines with short communication channels between different dies without the need for complex input/output (I/O) interfaces between the different types of functional dies which may degrade data transmission efficiency. As such, the system on silicon wafer (SoSW) provides for highly efficient system performance in a compact arrangement and package in a small form factor and without the need for an extra package structure to build system functions. Other silicon wafer process technologies (e.g., system-on-integrated circuit (SoIC), integrated passive device (IPD), combinations, or the like) may also be leveraged to further consolidate functionality into the system on silicon wafer package without the need of using more complex printed circuit board (PCB) designs to provide system functions. System function characteristics on the single wafer may include further modules (e.g., power module integrated circuit (PMIC), connectors, combinations, or the like) which may provide added system functionality and interfaces for other device integration.

In accordance with an embodiment, a method includes: forming a first semiconductor die of a first type in a silicon substrate; forming a second semiconductor die of a second type in the silicon substrate, the second type being different from the first type; without singulating the first semiconductor die from the second semiconductor die, forming a local interconnect between the first semiconductor die and the second semiconductor die; and forming a semi-global interconnect over the local interconnect. In an embodiment the method further includes forming a third semiconductor die of a third type in the silicon substrate, the third semiconductor die being separated from the first semiconductor die by the second semiconductor die and the third type being different from the first type and being different from the second type. In an embodiment the forming the semi-global interconnect further includes forming the semi-global interconnect between the first semiconductor die and the third semiconductor die. In an embodiment the method further includes forming through substrate vias through the silicon substrate. In an embodiment the forming the first semiconductor die includes forming a first die pattern in the silicon substrate using a first mask set; and the forming the second semiconductor die includes forming a second die pattern in the silicon substrate using a second mask set different from the first mask set. In an embodiment the method further includes forming an intermediate device in the silicon substrate, the intermediate device separating the first semiconductor die from the second semiconductor die. In an embodiment the forming the local interconnect comprises electrically coupling the intermediate device to the first semiconductor die.

In accordance with another embodiment, a method includes: forming a first die at least partially within a semiconductor substrate, the first die having a first size; forming a second die at least partially within the semiconductor substrate, the second die having a second size different from the first size; forming a third die at least partially within the semiconductor substrate, the third die being separated from the first die by the second die; forming a first set of metallization layers over and electrically coupling the first die and the second die; and forming a second set of metallization layers over the first set of metallization layers, wherein the second set of metallization layers and the first set of metallization layers connect the third die and the first die. In an embodiment the method further includes forming an intermediate passive device in the semiconductor substrate, the intermediate passive device separating the first die from the second die. In an embodiment the forming the first set of metallization layers comprises electrically coupling the intermediate passive device to the first die. In an embodiment the third die has a third size different from the first size and the second size. In an embodiment the method further includes forming an integrated fan-out structure over an opposite side of the semiconductor substrate from the first metallization layer. In an embodiment the method further includes attaching a heat sink to the integrated fan-out structure. In an embodiment the method further includes connecting a power module to the second set of metallization layers.

In accordance with yet another embodiment, a semiconductor device includes: a plurality of semiconductor dies, each one of the plurality of semiconductor dies being located at least partially within a semiconductor substrate; a first inter-function die interconnect electrically coupling a first multiple of the plurality of semiconductor dies, the first inter-function die interconnect being located adjacent to a first side of the semiconductor substrate; and an integrated fan-out structure located adjacent to a second side of the semiconductor substrate opposite the first side, the integrated fan-out structure electrically connecting a second multiple of the plurality of semiconductor dies. In an embodiment the semiconductor device further includes an intermediate device, wherein the first inter-function die interconnect electrically couples the intermediate device to the first multiple of the plurality of semiconductor dies. In an embodiment the semiconductor device further includes through-substrate vias electrically connecting the integrated fan-out structure and the first inter-function die interconnect. In an embodiment the semiconductor device further includes a global interconnect located over the first inter-function die interconnect, the global interconnect electrically connecting a first one of the plurality of semiconductor dies to a second one of the plurality of semiconductor dies, the second one of the plurality of semiconductor dies being separated from the first one of the plurality of semiconductor dies by at least one additional one of the plurality of semiconductor dies. In an embodiment the first multiple of the plurality of semiconductor dies comprises a first die with a first function, a second die with a second function, and a third die with a third function, wherein the first function, the second function, and the third function are all different from each other. In an embodiment the first die is a central processing unit and the second die is a graphics processing unit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a plurality of semiconductor dies at least partially within a semiconductor substrate;
    forming a first local interconnect adjacent to a first side of the semiconductor substrate, wherein the first local interconnect electrically couples a first semiconductor die of the plurality of semiconductor dies to a second semiconductor die of the plurality of semiconductor dies, the first local interconnect passing across a scribe region disposed between the first semiconductor die and the second semiconductor die; and
    forming an integrated fan-out structure adjacent to a second side of the semiconductor substrate opposite the first side, wherein the integrated fan-out structure electrically couples a third semiconductor die of the plurality of semiconductor dies to the first semiconductor die of the plurality of semiconductor dies.

2. The method of claim 1, further comprising forming an intermediate device, wherein the first local interconnect electrically couples the intermediate device to the first semiconductor die and to the second semiconductor die.

3. The method of claim 1, further comprising forming through-substrate vias through the semiconductor substrate, wherein the through-substrate vias electrically couple the integrated fan-out structure to the first local interconnect.

4. The method of claim 1, further comprising forming a global interconnect structure over the first local interconnect, wherein the global interconnect structure electrically couples the first semiconductor die to the third semiconductor die, the second semiconductor die being in between the first semiconductor die and the third semiconductor die.

5. The method of claim 4, further comprising attaching a power module to the global interconnect structure opposite the first local interconnect.

6. The method of claim 4, further comprising attaching a receptor for high-speed serial digital interface cables to the global interconnect structure opposite the first local interconnect.

7. The method of claim 1, wherein the first semiconductor die comprises a first function, the second semiconductor die comprises a second function, and the third semiconductor die comprises a third function, wherein the first function, the second function, and the third function are all different from each other.

8. The method of claim 7, wherein the first semiconductor die is a digital signal processing core, the second semiconductor die is a central processing unit, and the third semiconductor die is a graphics processing unit.

9. A method comprising:
    forming a first die at least partially within a semiconductor substrate;
    forming a second die at least partially within the semiconductor substrate;

forming a third die at least partially within the semiconductor substrate, the second die being between the first die and the third die;

forming a first set of metallization layers in direct physical contact with the first die and the second die, wherein the first die and the second die are electrically connected through the first set of metallization layers;

forming a second set of metallization layers on the first set of metallization layers opposite the first die and the second die, wherein the second set of metallization layers and the first set of metallization layers electrically connect the third die and the first die, wherein the first set of metallization layers is between the semiconductor substrate and the second set of metallization layers; and forming a backside redistribution structure on the semiconductor substrate opposite the first set of metallization layers.

10. The method of claim 9, wherein the first die has a first size and the second die has a second size different from the first size.

11. The method of claim 9, further comprising forming through substrate vias through the semiconductor substrate, wherein the through substrate vias electrically couples the backside redistribution structure to the first set of metallization layers.

12. The method of claim 9, further comprising attaching a thermal module to the backside redistribution structure opposite the semiconductor substrate.

13. The method of claim 12, wherein the attaching the thermal module to the backside redistribution structure utilizes a thermal adhesive.

14. The method of claim 12, further comprising fastening the thermal module to the backside redistribution structure utilizing a screw assembly.

15. The method of claim 9, further comprising attaching a power module to the second set of metallization layers opposite the first set of metallization layers.

16. A method comprising:

forming a first semiconductor die of a first type at least partially within a substrate;

forming a second semiconductor die of a second type at least partially within the substrate, the second type being different from the first type;

forming a third semiconductor die of a third type at least partially within the substrate, the third type being different from the second type;

forming a local interconnect over the first semiconductor die and the second semiconductor die, wherein the local interconnect is in direct physical contact with the first semiconductor die and the second semiconductor die;

forming a semi-global interconnect over the local interconnect, wherein the local interconnect is between the semi-global interconnect and the substrate; and fastening a thermal module to the substrate with a screw assembly.

17. The method of claim 16, further comprising attaching a power module to the semi-global interconnect opposite the local interconnect.

18. The method of claim 16, wherein the fastening the thermal module to the substrate with the screw assembly comprises utilizing a bolt extending through the thermal module, the substrate, the local interconnect, and the semi-global interconnect and fasteners on each end of the bolt to fasten the thermal module.

19. The method of claim 16, further comprising forming a backside redistribution structure on the substrate opposite the local interconnect.

20. The method of claim 19, wherein the backside redistribution structure is electrically coupled to the local interconnect by a through substrate via.

* * * * *